(12) United States Patent
Lueger

(10) Patent No.: US 11,294,055 B2
(45) Date of Patent: Apr. 5, 2022

(54) DRIVING CIRCUIT TO GENERATE A SIGNAL PULSE FOR OPERATING A LIGHT-EMITTING DIODE

(71) Applicant: ams AG, Premstaetten (AT)

(72) Inventor: Manfred Lueger, Stainz (AT)

(73) Assignee: AMS AG, Premstaetten (AT)

( * ) Notice: Subject to any disclaimer, the term of this patent is extended or adjusted under 35 U.S.C. 154(b) by 325 days.

(21) Appl. No.: 16/313,313

(22) PCT Filed: Jun. 9, 2017

(86) PCT No.: PCT/EP2017/064172
§ 371 (c)(1),
(2) Date: Dec. 26, 2018

(87) PCT Pub. No.: WO2018/001701
PCT Pub. Date: Jan. 4, 2018

(65) Prior Publication Data
US 2020/0396813 A1     Dec. 17, 2020

(30) Foreign Application Priority Data
Jun. 28, 2016 (EP) .................................. 16176668

(51) Int. Cl.
*H05B 47/10* (2020.01)
*G01S 17/10* (2020.01)
(Continued)

(52) U.S. Cl.
CPC ............. *G01S 17/10* (2013.01); *G01S 7/484* (2013.01); *H05B 45/32* (2020.01); *H03K 3/57* (2013.01)

(58) Field of Classification Search
CPC ............ H05B 47/10; G01S 7/484; H03K 3/57
(Continued)

(56) References Cited

U.S. PATENT DOCUMENTS 7,276,960 B2 * 10/2007 Peschke .................. H02M 3/07
                                                327/536
7,352,786 B2 *  4/2008 Ikeda ..................... H01S 5/0427
                                               372/38.01
(Continued)

FOREIGN PATENT DOCUMENTS

CN          1166248 C       9/2004
CN        101894540 A      11/2010
(Continued)

OTHER PUBLICATIONS

Office Action issued in Chinese Application No. 201780039833.0, dated Apr. 2, 2020, 6 pages.
(Continued)

*Primary Examiner* — Alexander H Taningco
*Assistant Examiner* — Amy X Yang
(74) *Attorney, Agent, or Firm* — MH2 Technology Law Group LLP

(57) ABSTRACT

A driving circuit (10) to generate a signal pulse for operating a light-emitting diode (20) comprises an external terminal (LEDK, LEDA) to connect the light-emitting diode (20) to the driving circuit (10). In a first operating state/pre-charge state of the driving circuit (10), a first controllable switching circuit (100) connects a first side (301) of a capacitor (300) to a reference potential (Vref) and a second controllable switch (200) connects a second side (302) of the capacitor (300) to one of a supply and ground potential (VDD, VSS). In a second operating state of the driving circuit (10), the first controllable switching circuit (100) connects the first side (301) of the capacitor (300) to said one of the supply and ground potential (VDD, VSS) and the second controllable switch (200) connects the second side (302) of the capacitor (300) to the external terminal (LEDK, LEDA) to provide a signal pulse for operating the light emitting diode.

15 Claims, 9 Drawing Sheets

(51) Int. Cl.
  *G01S 7/484* (2006.01)
  *H05B 45/32* (2020.01)
  *H03K 3/57* (2006.01)

(58) Field of Classification Search
  USPC .......................................................... 315/224
  See application file for complete search history.

(56) References Cited

U.S. PATENT DOCUMENTS

| | | | | |
|---|---|---|---|---|
| 8,614,652 | B2* | 12/2013 | Nathan | G09G 3/3258 |
| | | | | 345/55 |
| 2001/0006521 | A1 | 7/2001 | Eum | |
| 2007/0205819 | A1 | 9/2007 | Park | |
| 2009/0284178 | A1* | 11/2009 | Jessenig | H02M 3/156 |
| | | | | 315/297 |
| 2010/0283322 | A1* | 11/2010 | Wibben | H02M 3/158 |
| | | | | 307/31 |
| 2013/0235366 | A1* | 9/2013 | Giacotto | G01S 7/484 |
| | | | | 356/5.01 |
| 2015/0346325 | A1* | 12/2015 | Giacotto | G01S 17/10 |
| | | | | 356/5.01 |
| 2019/0386460 | A1* | 12/2019 | Barnes | H01S 5/0261 |

FOREIGN PATENT DOCUMENTS

| | | |
|---|---|---|
| DE | 10 2008 021588 | 12/2009 |
| EP | 2637038 | 9/2013 |
| WO | 2009/132631 | 11/2009 |

OTHER PUBLICATIONS

European Patent Office, International Search Report for PCT/EP2017/064172, dated Jul. 6, 2017.

Chujo et al., "A 25 GB/s 65-nm CMOS Low-Power Laser Diode Driver With Mutually Coupled Peaking Inductors for Optical Interconnects", IEEE Transactions on Circuits and Systems-I Regular Papers, (58):9: 2061-2068, Sep. 2011.

Kromer et al., "A 100-mW 4 10 GB/s Transceiver in 80-nm CMOS for High-Density Optical Interconnects", IEEE Journal of Solid-State Circuits, (40):12, Dec. 2005.

Kostamovaara et al., "On Laser Ranging Based on High-Speed/Energy Laser Diode Pulses and Single-Photon Detection Techniques", IEEE Photonics Journal, (7):2, Apr. 2015 (16 pages).

\* cited by examiner

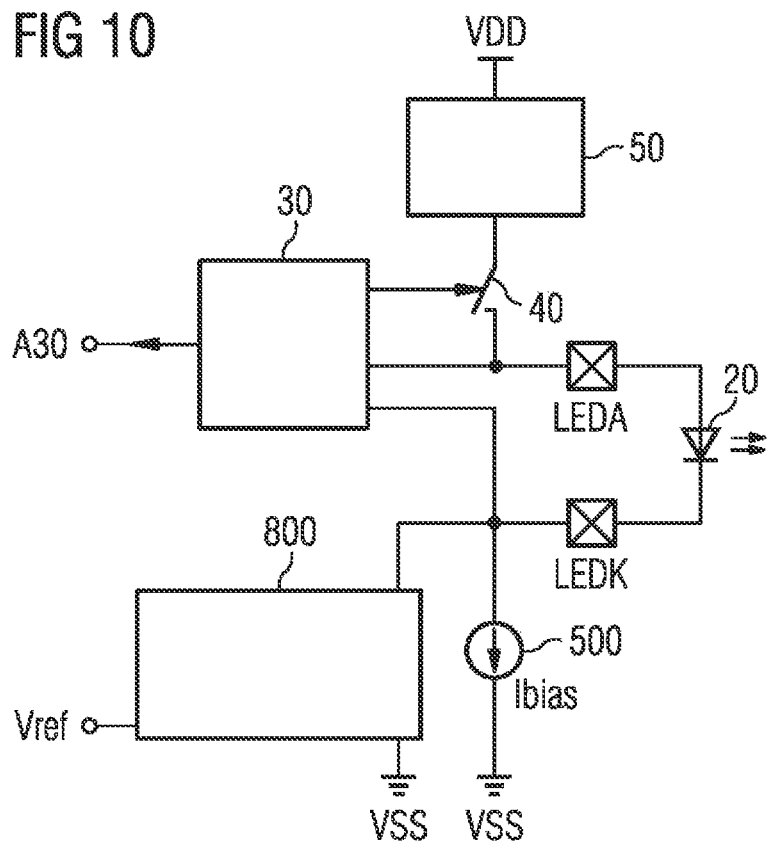

DRIVING CIRCUIT TO GENERATE A SIGNAL PULSE FOR OPERATING A LIGHT-EMITTING DIODE

TECHNICAL FIELD

The invention is directed to a driving circuit to generate a signal pulse for operating a light-emitting diode, for example a laser diode. The invention is further directed to an arrangement to provide light pulses, particularly a plurality of ultrashort light pulses of a laser diode.

BACKGROUND

The generation of light pulses of a light-emitting diode, especially a laser diode, may be controlled by a driving circuit that generates a driving current being applied to the light-emitting diode. If the driving current is above a lasing-threshold of the driven diode, a light signal is generated by the light-emitting diode.

For a time-of-flight measurement system a laser diode may be used that has to send out very short high power laser pulses. The shorter the pulse length, the more accurately the time between sending and receiving the pulse can be distinguished. To measure a distance of, for example, 1 cm, a timing precision of about 57 ps is necessary. To achieve this resolution, the results of multiple measurements have to be averaged. If the laser diode could be controlled to send out pulses with shorter pulse-width, it would be possible to send out less pulses and get the required accuracy in a shorter time. The power consumption and the total measurement time are proportional to the number of laser pulses so that both are also reduced by having shorter pulse width.

Another benefit of having shorter pulses of a laser diode is related to eye safety. If laser pulses having a short width could be generated, it would be allowed to send pulses with higher amplitude without posing any danger for the human eye. Regarding the time-of-flight measurement, laser pulses having a high amplitude can be used to measure long distances. The higher the amplitude, the longer is the maximum distance that can be measured.

It is a desire to provide a driving circuit to generate a signal pulse or a plurality of signal pulses, for example current/voltage pulses, for operating a light-emitting diode that enables to generate an ultrashort light pulse or a plurality of subsequent ultrashort light pulses by the light-emitting diode respectively having a high amplitude. It is further desirable to provide an arrangement to provide light pulses, especially laser pulses, respectively having an ultra-short width and a high amplitude.

SUMMARY

A driving circuit to generate a signal pulse for operating a light-emitting diode, especially a laser diode, so that the laser diode generates an ultrashort light pulse with high amplitude is disclosed in claim 1.

The driving circuit comprises an external terminal to connect the light-emitting diode to the driving circuit, a first internal node to apply one of a supply and ground potential, a second internal node to apply a reference potential, a third internal node being connected to the external terminal, and a fourth internal node to apply one of the supply and ground potential. The driving circuit further comprises a capacitor to provide a charge to generate the signal pulse at the external terminal for operating the light-emitting diode. The driving circuit comprises a first and a second controllable switching circuit.

The capacitor has a first side being coupled to the first controllable switching circuit and a second side being coupled to the second controllable switching circuit. The first controllable switching circuit is configured to connect the first side of the capacitor to one of the first internal node and the second internal node. The second controllable switching circuit is configured to connect the second side of the capacitor to one of the third internal node and the fourth internal node.

An embodiment of an arrangement to provide light pulses, especially laser pulses, having a high amplitude and an ultrashort width is specified in claim 13.

The arrangement comprises a light-emitting diode and a driving circuit to generate a signal pulse for operating the light-emitting diode as described above and specified in any of the claims 1 to 12. The light-emitting diode is connected to the external terminal of the driving circuit.

The driving circuit provides a fully integrated single wide range supply solution for driving ultrashort sub-nanosecond light/laser pulses with more than 50 mA peak output current. The driving circuit uses an integrated switched capacitor topology for bootstrapping the light-emitting diode driver output.

Additional features and advantages are set forth in the Detailed Description that follows, and in part will be readily apparent to those skilled in the art from the description or recognized by practicing the embodiments as described in the written description and claims hereof, as well as the appended drawings. It is to be understood that both the foregoing general description and the following Detailed Description are merely exemplary, and are intended to provide an overview or framework to understand the nature and character of the claims.

BRIEF DESCRIPTION OF THE DRAWINGS

The accompanying Figures are included to provide a further understanding, and are incorporated in and constitute a part of this specification. The drawings illustrate one or more embodiments, and together with the Detailed Description serve to explain principles and operations of the various embodiments. As such, the disclosure will become more fully understood from the following Detailed Description, taken in conjunction with the accompanying Figures, in which:

FIG. 10 shows an embodiment of an arrangement to provide light pulses comprising a driving circuit according to a "common anode" topology and an eye safety control circuit and a charge pump to boost a light power emitted by a light-emitting diode.

DETAILED DESCRIPTION

Figure 1:
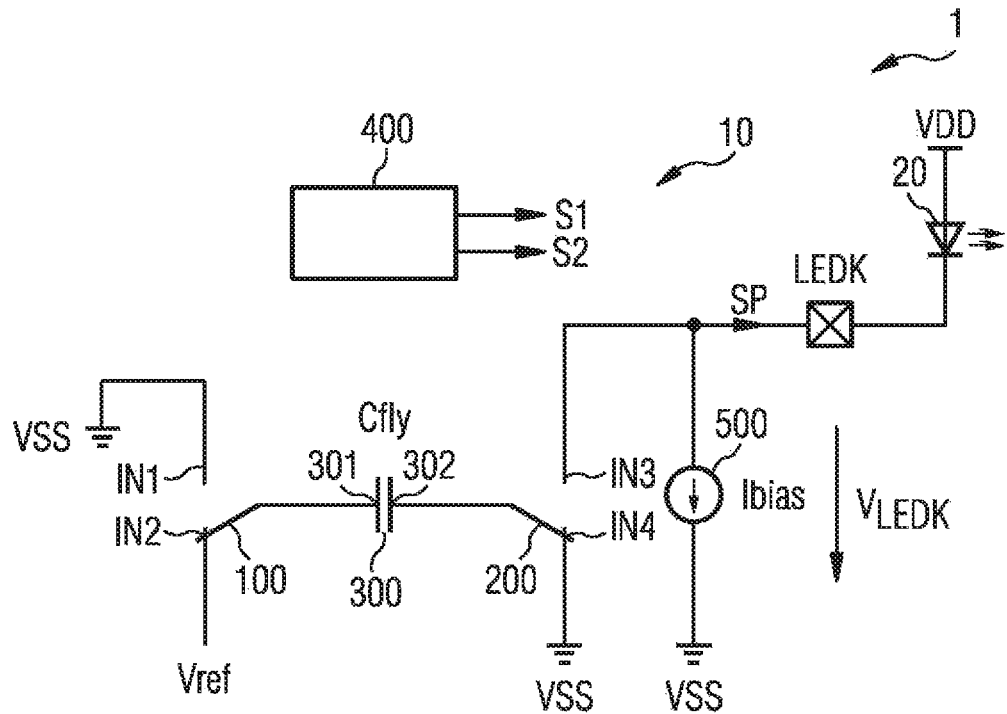
FIG. 1 shows an embodiment of an arrangement to provide light pulses comprising a driving circuit according to a "common anode" topology to generate at least one signal pulse for operating a light-emitting diode.

FIG. 1 shows an embodiment of an arrangement 1 to provide light pulses comprising a driving circuit 10 according to a "common anode" topology. The driving circuit 10 is configured to generate the signal pulse SP for operating the light-emitting diode. The light-emitting diode may preferably be embodied as a laser diode. The driving circuit 10 comprises an external terminal LEDK to connect the light-emitting diode 20 to the driving circuit 10. According to the "common anode" topology shown in FIG. 1, the light-emitting diode is connected between the supply potential VDD and the external terminal LEDK of the driving circuit. The supply potential VDD may be a positive supply voltage.

The driving circuit 10 further comprises a plurality of internal nodes. A first internal node IN1 of the driving circuit is configured to apply a ground potential VSS. The driving circuit 10 further comprises a second internal node IN2 to apply a reference potential Vref. The reference potential Vref may be between the supply potential VDD and the ground potential VSS. A third internal node IN3 of the driving circuit 10 is connected to the external terminal LEDK. The driving circuit 10 further comprises a fourth internal node IN4 to apply the ground potential VSS.

The driving circuit 10 comprises a capacitor to provide a charge to generate the signal pulse SP at the external terminal LEDK of the driving circuit for operating the light-emitting diode 20. The driving circuit 10 further comprises a first controllable switching circuit 100 and a second controllable switching circuit 200. The capacitor 300 has a first side 301 being coupled to the first controllable switching circuit 100 and a second side 302 being coupled to the second controllable switching circuit 200. The first controllable switching circuit 100 is configured to connect the first side 301 of the capacitor 300 to one of the first internal node IN1 and the second internal node IN2. The second controllable switching circuit 200 is configured to connect the second side 302 of the capacitor 300 to one of the third internal node IN3 and the fourth internal node IN4.

According to the embodiment of the driving circuit 10 shown in FIG. 1, the driving circuit 10 is operable in a first and a second operating state. In the first operating state of the driving circuit, the first controllable switching circuit 100 connects the first side 301 of the capacitor 300 to the reference potential Vref, and the second controllable switching circuit 200 connects the second side 302 of the capacitor 300 to the ground potential VSS. In the second operating state of the driving circuit 10, the first controllable switching circuit 100 connects the first side 301 of the capacitor 300 to the ground potential VSS, and the second controllable switching circuit 200 connects the second side 302 of the capacitor 300 to the external terminal LEDK.

The driving circuit 10 is configured as a pulse generator/charge pump for generating signal pulses SP at the external terminal LEDK. The capacitor 300 is configured as the flying capacitor of the driving circuit. FIG. 1 illustrates the first operating state of the driving circuit 10, wherein the (flying) capacitor 300 is charged to the reference potential Vref that is between the supply potential VDD and the ground potential VSS. The first operating state of the driving circuit is the pre-charge state. In the first operating state of the driving circuit 10, the first controllable switching circuit 100 connects the first side 301 of the capacitor 300 to the reference potential Vref, and the second controllable switching circuit 200 connects the second side 302 of the capacitor 300 to the ground potential VSS.

The energy $E_P$ that is stored in the capacitor 300 during the first operating state/pre-charge state of the driving circuit 10 is $$E_P = C_{fly} * Vref^2/2$$

wherein $C_{fly}$ is the capacitance of the (flying) capacitor 300.

The driving circuit 10 comprises a control circuit 400 that is configured to provide a first control signal S1 to control the switching state of the first controllable switching circuit 100 and a second control signal S2 to control the switching state of the second controllable switching circuit 200. According to a possible embodiment of the driving circuit 10, the control circuit 400 may be configured to generate the first and second control signal S1 and S2 at the same time.

In order to send out a light pulse by the light-emitting diode 20, the driving circuit 10 is operated in the second operating state. In the second operating state, the control circuit 400 generates the first control signal S1 and the second control signal S2 so that the first side 301 of the capacitor 300 is connected by the first controllable switching circuit 100 to the ground potential VSS. Furthermore, the control circuit 400 generates the second control signal S2 such that the second side 302 of the capacitor 300 is connected to the external terminal LEDK of the driving circuit 10.

During the first operating state of the driving circuit 10, the potential that drops at the external terminal LEDK is $V_{LEDK}$. In the switching state of the first controllable switching circuit 100 and the second controllable switching circuit 200 during the second operating state of the driving circuit, the capacitor 300 is immediately discharged to the externally connected light-emitting diode 20, for example a laser diode that is connected to the external terminal LEDK. When the controllable switching circuits 100 and 200 are switched in the second operating state, the (flying) capacitor 300 becomes negatively discharged to the potential $-V_{LEDK}$. In this case, the total emitted energy provided by the driving circuit 10 to the light-emitting diode 20 is $$E_{out} = C_{fly} * (Vref + V_{LEDK})^2/2$$

that is even larger than the energy $E_P$ stored in the capacitor 300 during the first operating state/pre-charge state of the driving circuit 10.

The driving circuit 10 may comprise a current source 500 to provide a bias current Ibias to the external terminal LEDK. The current source 500 is arranged between the external terminal LEDK and a terminal for applying the ground potential VSS. The current source 500 to generate the bias current Ibias enables to provide a short startup time of the light-emitting diode. The level of the bias current Ibias can be fixed or variable. According to a preferred embodiment, the level of the bias current Ibias is set below the lasing-threshold level of the light-emitting diode 300 so that any transmission of light by the light-emitting diode during the first operating state/pre-charge state of the driving circuit is avoided.

Figure 2:
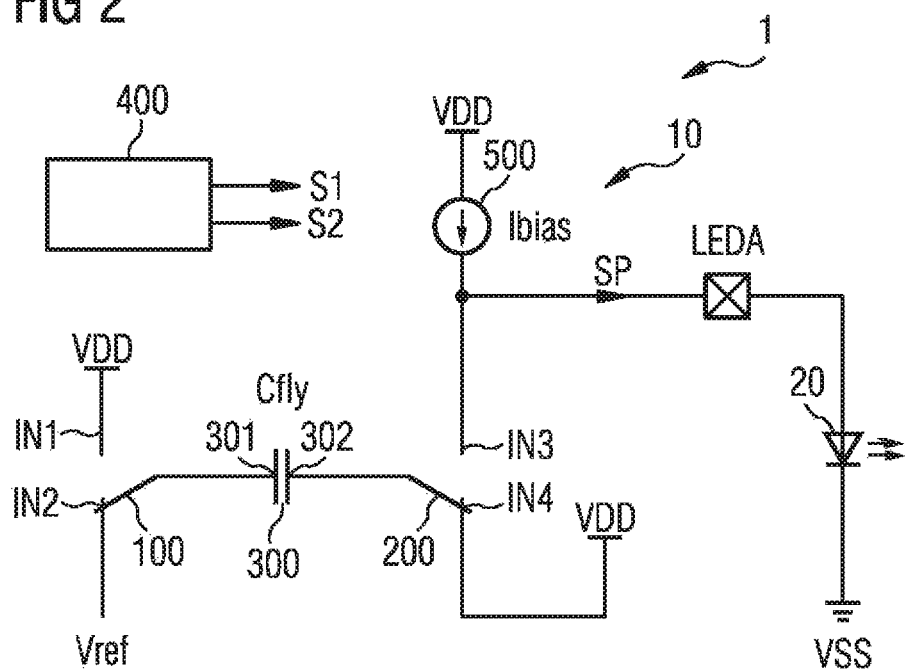
FIG. 2 shows an embodiment of an arrangement to provide light pulses comprising a driving circuit according to a "common cathode" topology to generate at least one signal pulse for operating a light-emitting diode.

FIG. 2 shows an alternative embodiment of an arrangement to provide light pulses comprising a driving circuit that fits for the "common cathode" topology. According to the "common anode" topology of the driving circuit shown in FIG. 1, the anode of the light-emitting diode is connected to the supply potential VDD and the cathode of the light-emitting diode 20 is driven by the driving circuit 10. According to the "common cathode" topology of the driving circuit 10 shown in FIG. 2, the cathode of the light-emitting diode 20 is connected to the ground potential VSS and the anode of the light-emitting diode 20 is connected to the external terminal LEDA and is thus driven by the driving circuit 10.

As shown in FIG. 2 the driving circuit 10 comprises an external terminal LEDA to connect the light-emitting diode 20 to the driving circuit 10. The driving circuit 10 comprises a first internal node IN1 to apply the supply potential VDD, for example a positive supply voltage. The driving circuit 10 further comprises a second internal node IN2 to apply a reference potential Vref that is between the supply potential VDD and the ground potential VSS. The driving circuit 10 comprises a third internal node IN3 being connected to the external terminal LEDA and a fourth internal node IN4 to apply the first supply potential VDD.

According to the embodiment of the driving circuit 10 of FIG. 2, the driving circuit comprises a capacitor 300 to provide a charge to generate the signal pulse SP, for example a current or voltage pulse, at the external terminal LEDA for operating the light-emitting diode 20. The driving circuit 10 further comprises a first controllable switching circuit 100 and a second controllable switching circuit 200. The capacitor 300 has a first side 301 that is coupled to the first controllable switching circuit 100 and a second side 302 that is coupled to the second controllable switching circuit 200. The first controllable switching circuit 100 is configured to connect the first side 301 of the capacitor 300 to one of the first internal node IN1 and the second internal node IN2. The second controllable switching circuit 200 is configured to connect the second side 302 of the capacitor 300 to one of the third internal node IN3 and the fourth internal node IN4.

The driving circuit 10 of FIG. 2 comprises a control circuit 400 being configured to provide a first control signal S1 to control the first controllable switching circuit 100 and a second control signal S2 to control the second controllable switching circuit 200. The control circuit 400 may be configured to generate the first and the second control signal S1, S2 simultaneously.

The driving circuit 10 of FIG. 2 is operable in a first and a second operating state. The first operating state is the pre-charge operating state. In order to operate the driving circuit in the first operating state, the control circuit 400 generates the control signals S1 and S2 so that the first controllable switching circuit 100 connects the first side 301 of the capacitor 300 to the reference potential Vref and the second controllable switching circuit 200 connects the second side 302 of the capacitor 300 to the supply potential VDD. FIG. 2 shows the pre-charge state, wherein the capacitor 300 is charged.

In order to provide the signal pulse SP to the external terminal LEDA to operate the light-emitting diode 20 such that the light-emitting diode sends out a light pulse, the driving circuit 10 is switched in the second operating state by means of the control circuit 400. In the second operating state, the first controllable switching circuit 100 connects the first side 301 of the capacitor 300 to the supply potential VDD and the second controllable switching circuit 200 connects the second side 302 of the capacitor 300 to the external terminal LEDA.

In order to operate the driving circuit 10 in the second operating state, the control circuit 400 generates the first control signal S1 and the second control signal S2 such that the first side 301 of the capacitor 300 is connected by means of the first controllable switching circuit 100 to the supply potential VDD, and that the second side 302 of the capacitor 300 is coupled by means of the second controllable switching circuit 200 to the external terminal LEDA. After being switched in the second operating state, the capacitor 300 is immediately discharged to the externally connected light-emitting diode 20. The signal pulse generated by the flying capacitor 300 during discharge of the capacitor causes a light pulse sent out by the light-emitting diode.

The driving circuit 10 of FIG. 2 may comprise a current source 500 to provide a bias current Ibias to the external terminal LEDA. The current source 500 is arranged between the external terminal LEDA and a terminal to apply the supply potential VDD. The bias current source 500 allows to achieve a short start-up time of the light-emitting diode 20. The value of the bias current can be fixed or variable. According to a preferred embodiment the value of the bias current Ibias is set below the lasing threshold of the light-emitting diode 20 so that it is ensured that no light pulses are sent out by the diode 20 during the first operating state of the driving circuit.

According to the embodiments of the arrangement 1 to provide light pulses shown in FIGS. 1 and 2, the light-emitting diode 20 is connected to the external terminal LEDK/LEDA of the driving circuit 10. The driving circuit 10 is configured as a charge pump/pulse generator, wherein the capacitor 300 is configured as a flying capacitor that is charged to the reference potential Vref during the pre-charge state of the driving circuit.

Figure 3:
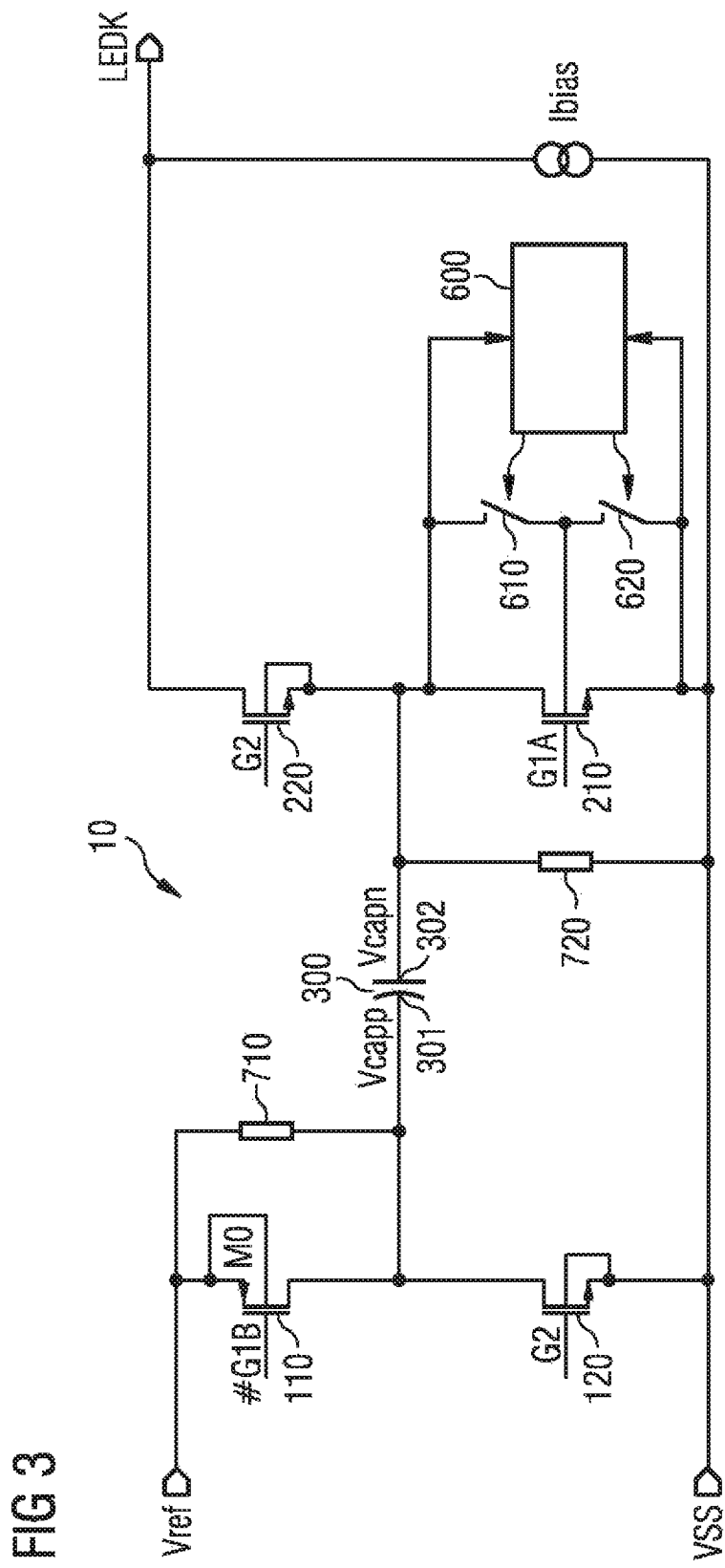
FIG. 3 shows an embodiment of an electrical circuit being a possible implementation of a driving circuit for operating a light-emitting diode according to the "common anode" topology.

FIG. 3 shows a possible implementation for a driving circuit 10 of the "common anode" topology, as shown in FIG. 1. The first controllable switching circuit 100 comprises a first controllable switch 110 and a second controllable switch 120. The first controllable switch 110 of the first controllable switching circuit 100 is arranged between the first side 301 of the capacitor 300 and the reference potential Vref. The second controllable switch 120 of the first controllable switching circuit 100 is arranged between the first side 301 of the capacitor 300 and the ground potential VSS.

The second controllable switching circuit 200 comprises a first controllable switch 210 and a second controllable switch 220. The first controllable switch 210 of the second controllable switching circuit 200 is arranged between the second side 302 of the capacitor 300 and the ground potential VSS. The second controllable switch 220 of the second controllable switching circuit 200 is arranged between the second side 302 of the capacitor 300 and the external terminal LEDK.

According to the "common anode" topology of the driving circuit 10, the controllable switches 110, 120 and 210, 220 are embodied as transistors. In particular, the controllable switches 120, 210 and 220 are respectively configured as NMOS transistors and the controllable switch 110 is configured as a PMOS transistor.

According to the embodiment of the driving circuit 10 shown in FIG. 3, the driving circuit 10 comprises a controllable bulk switch 600 to selectively connect a bulk connection of the transistor of the first controllable switch 210 of the second controllable switching circuit 200 to one of the second side 302 of the capacitor 300 and the ground potential VSS. The bulk switch comprises the controllable switches 610 and 620.

In the first operating state/pre-charge state of the driving circuit 10, the controllable bulk switch 600 is controlled such that the bulk connection of the transistor of the first controllable switch 210 of the second controllable switching circuit 200 is connected to the ground potential VSS. That means that the controllable switch 610 is turned in the non-conductive state and the controllable switch 620 is turned in the conductive state. In the second operating state of the driving circuit 10, the controllable bulk switch 600 is controlled such that the bulk connection of the transistor of the first controllable switch 210 of the second controllable switching circuit 200 is connected to the second side 302 of the capacitor 300. To this purpose, the controllable switch 610 is turned in the conductive state and the controllable switch 620 is turned in the non-conductive state.

Figure 4:
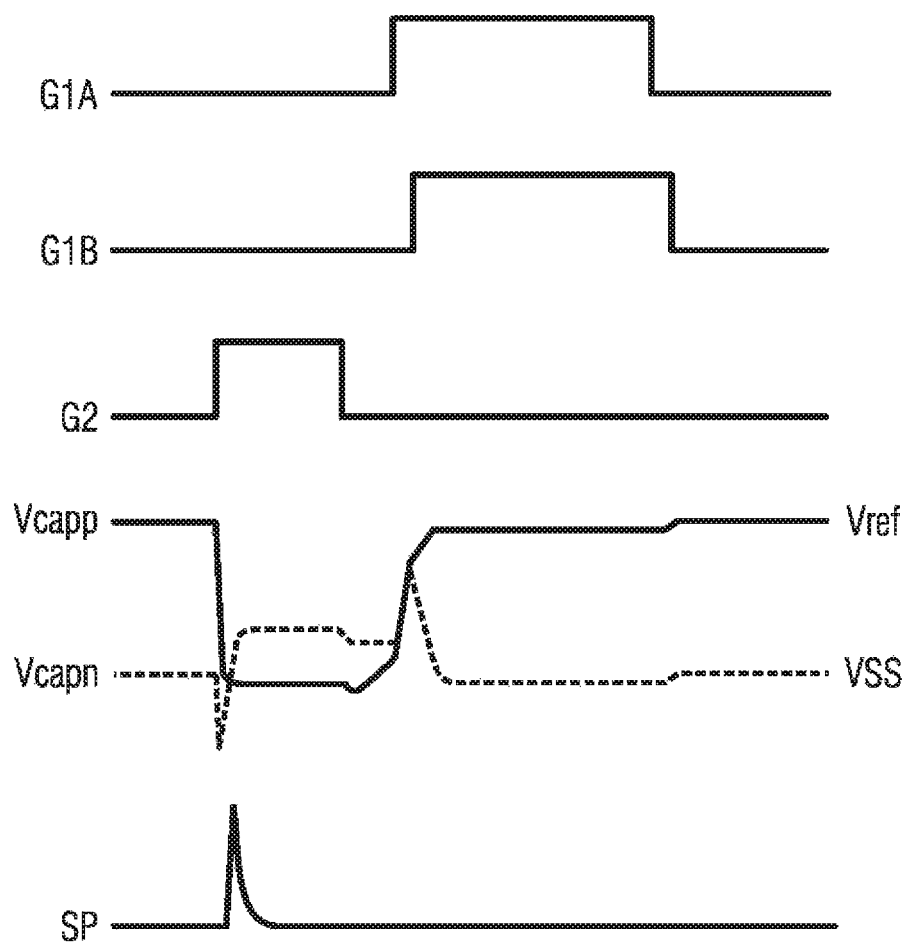
FIG. 4 illustrates a timing diagram of signals occurring in the electrical circuit according to the "common anode" topology.

FIG. 4 illustrates a timing diagram of a control signal G1A for controlling the controllable switch/transistor 210, a control signal G1B for controlling the controllable switch/transistor 110, and a control signal G2 for controlling the controllable switches 120, 220. FIG. 4 further illustrates the variation in time of the potential Vcapp at the first side 301 of the capacitor 300 and the potential Vcapn at the second side 302 of the capacitor 300. Furthermore, FIG. 4 illustrates the timing diagram of the pulse signal SP, for example a signal current SP flowing from the driving circuit 10 to the light-emitting diode 20 in the second operating state of the driving circuit. The control signals G1a, G1b and G2 are generated by a gate driver (not shown in the Figures) in dependence on the control signals S1 and S2.

As shown in FIG. 4, the rising edge of the control signal G2 triggers the charge transfer from the (flying) capacitor 300 to the light-emitting diode 20. At this time, the controllable switch/transistor 120 and the controllable switch/transistor 220 are turned on by applying the control signal G2 with the "high" level on their gate. Both switches 120 and 220 can be turned on and off at the same time or sequentially. According to a possible embodiment of the driving circuit, both switches 120 and 220 are connected to the same gate driver being coupled to the control circuit 400 and therefore they are turned on and off at the same time. This configuration helps to achieve a very small turn-on delay.

When the control signal G2 is applied to the gate connection of the controllable switch/transistor 120 and to the gate connection of the controllable switch/transistor 220 with a rising edge, the potential Vcapp at the first side 301 of the capacitor 300 drops from the reference potential Vref to the ground potential VSS. At the same time, the potential Vcapn at the second side 302 of the capacitor 300 temporarily falls to a level below the ground potential VSS. When the controllable switches 120 and 220 are switched in a conductive state (second operating state of the driving circuit), the capacitor 300 is immediately discharged and a signal pulse SP, for example a current peak, occurs at the external terminal LEDK, LEDA.

At this moment the light-emitting diode 20 sends out a light pulse, for example a laser light pulse. FIG. 4 shows that the control signal G2 for controlling the controllable switches/transistors 120 and 220 can be generated as a slow signal with a large pulse width. Nevertheless, an ultrashort signal pulse SP occurs at the external terminal LEDK, LEDA of the driving circuit.

After the capacitor 300 is discharged, the driving circuit is switched by means of the control circuit 400 in the first operating state in which the capacitor 300 is again charged to the reference potential Vref. In order to switch the driving circuit 10 in the first operating state, the control signal G2 is generated with a low level and the control signals G1A and G1B are generated with a high level.

The controllable bulk switch 600 is provided for controlling the controllable switch/transistor 210, because the drain voltage of this transistor, i.e. the voltage potential Vcapn at the second side 302 of the capacitor 300 shortly drops below the ground potential VSS when the control signal G2 is applied with the rising edge to the gate connections of the transistors/controllable switches 120 and 220, as shown in FIG. 4. At this moment, when the driving circuit is operated in the second operating state, the bulk connection of the controllable switch/transistor 210 is connected by means of the controllable bulk switch 600 to its drain connection to avoid that the bulk diode of the transistor 210 is forward biased and the capacitor 300 is discharged to the ground potential VSS. That means that the controllable switch 610 is switched in the conductive state and the controllable switch 620 is switched in the non-conductive state.

Figure 5:
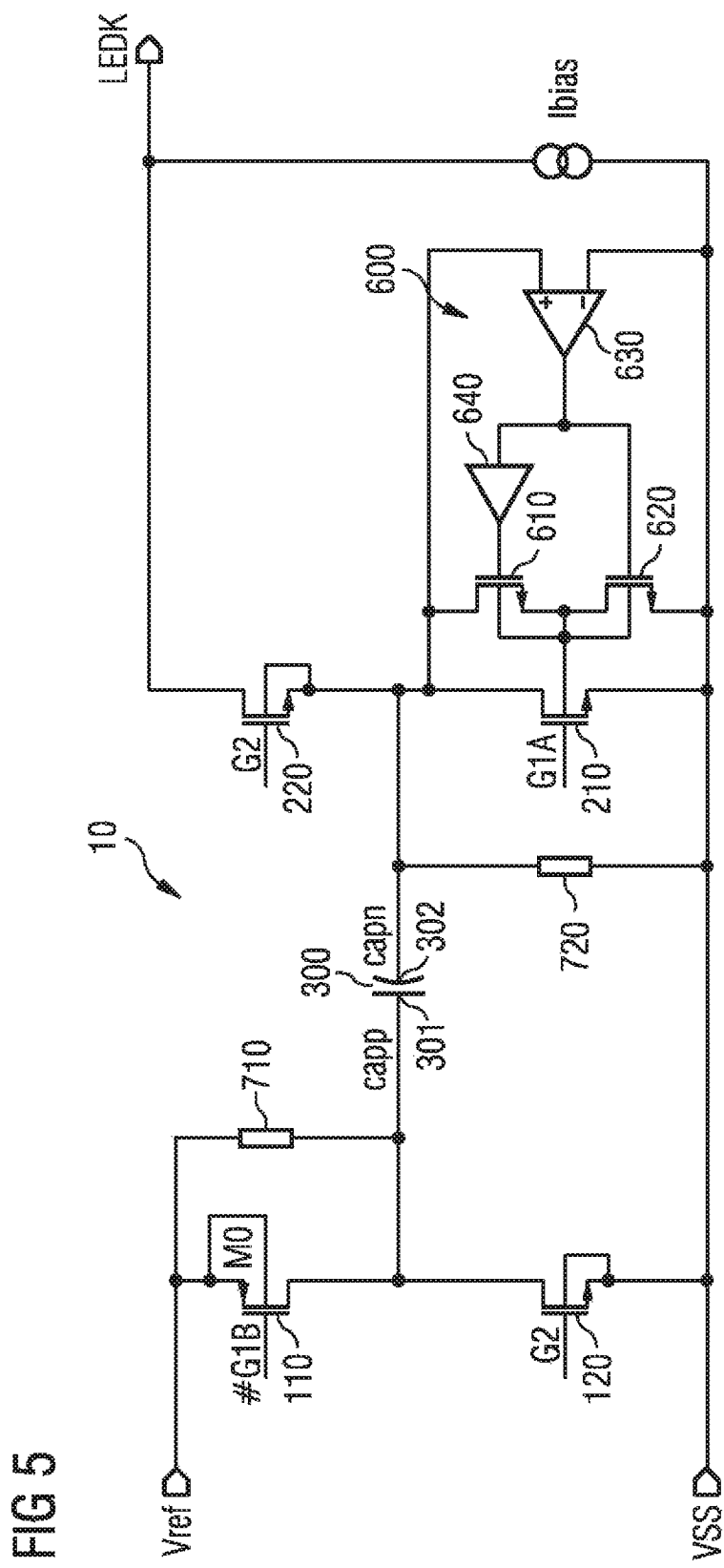
FIG. 5 shows another embodiment of an electrical circuit being a possible implementation of a driving circuit for operating a light-emitting diode according to the "common anode" topology.
Figure 6:
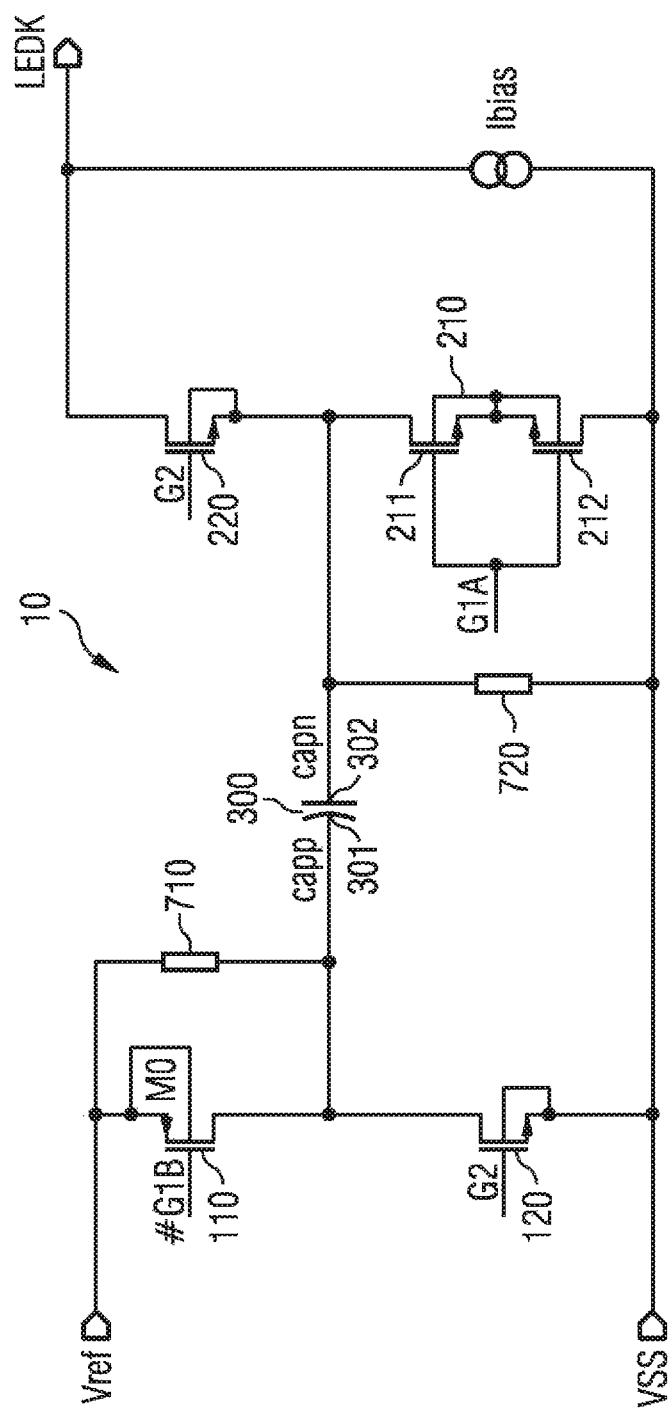
FIG. 6 shows another embodiment of an electrical circuit being another possible implementation of a driving circuit for operating a light-emitting diode in a "common anode" topology.

FIGS. 5 and 6 show several embodiments of the driving circuit 10 according to the "common anode" topology with different possibilities for the implementation of the controllable bulk switch 600. FIG. 5 shows a possible embodiment for an implementation of the controllable bulk switch 600, using a comparator-based bulk-switch topology. The controllable bulk switch 600 comprises a first transistor 610 and a second transistor 620 being connected in series between the second side 302 of the capacitor 300 and the ground potential VSS.

The drain connection of the transistor 610 is connected to the second side 302 of the capacitor 300. The source connection of the transistor 610 is connected to the drain connection of the transistor 620. The source connection of the transistor 620 is connected to the ground potential VSS. The bulk connections of the transistors 610, 620 and the transistor 210 are connected together to the source connection of the transistor 610/the drain connection of the transistor 620.

An operational amplifier 630 for controlling the respective gate connection of the transistors 610 and 620 is provided and connected with one of its input connections to the second side 302 of the capacitor 300 and with the other input connection to the ground potential VSS. An inverter 640 is connected between the output connection of the operational amplifier 630 and one of the gate connections of the transistors 610 and 620.

FIG. 6 shows an embodiment of the driving circuit 10, wherein the controllable switch 210 is embodied to ensure that, at the moment, when the drain voltage of the controllable switch 210 shortly drops below the ground potential, i.e. when the gate control signal G2 is applied with its rising edge to the respective gate connection of the transistors/controllable switches 120 and 220, the bulk connection of the controllable switch 210 is connected such that it is avoided that the bulk diode of the controllable switch 210 is forward biased and the flying capacitor 300 is discharged to ground.

The controllable switch 210 comprises a first transistor 211 and a second transistor 212 being connected in series between the ground potential VSS and the second side 302 of the capacitor 300 such that a drain connection of the transistor 211 of the controllable switch 210 is connected to the second side 302 of the capacitor 300 and a drain connection of the second transistor 212 of the controllable switch 210 is connected to the ground potential VSS. The transistors 211 and 212 may be configured according to the NMOS type.

According to the embodiment of the driving circuit 10 shown in FIG. 6, the controllable bulk switch 600 and the controllable switch 210 are embodied as a series connected NMOS transistor pair. A respective bulk connection of the transistors 211 and 212 is connected to the common source connection of the transistors 211 and 212. According to this embodiment, the switched bulk automatically becomes biased to the lower potential of both drain connections of the transistors 211 and 212 and therefore, one of the transistors is always operated in an open state when the gate is pulled "low".

Figure 7:
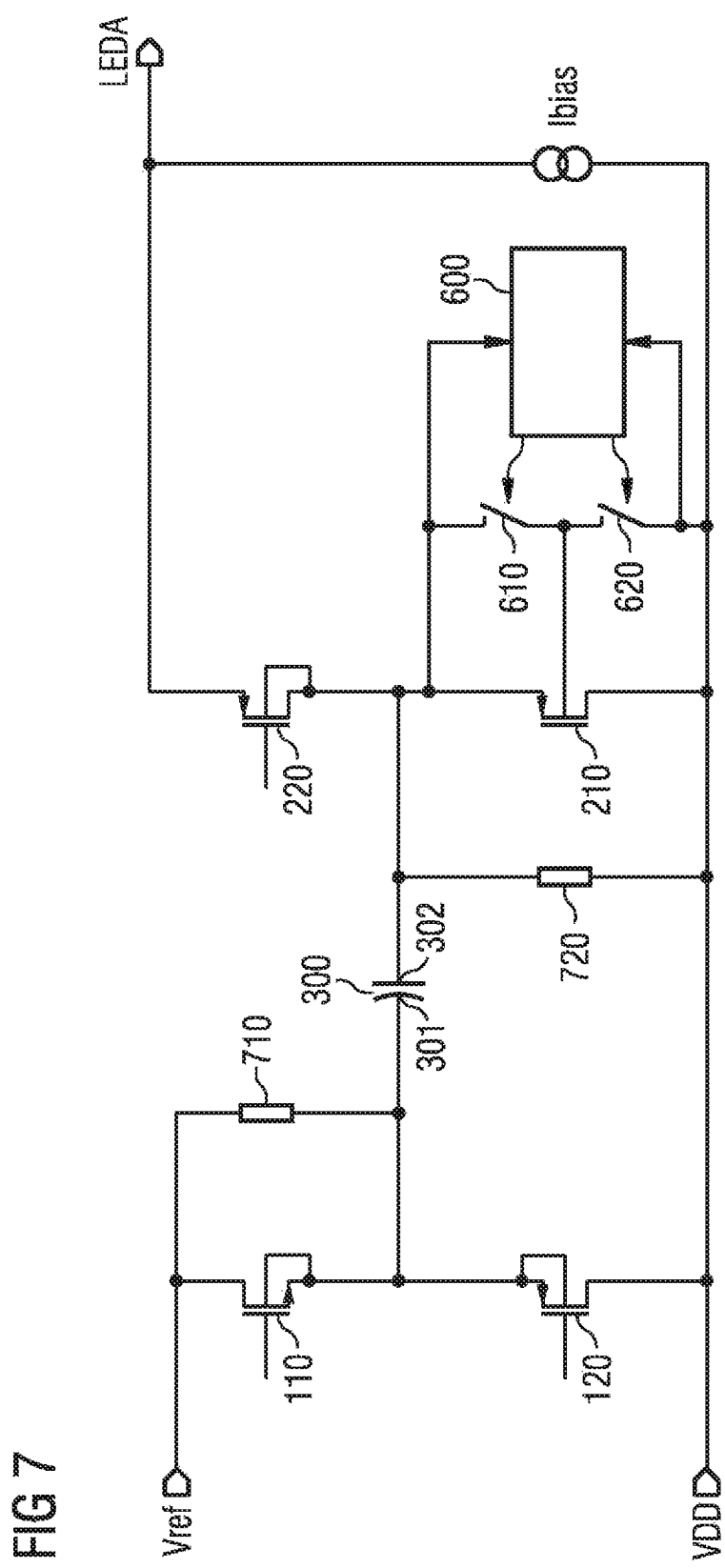
FIG. 7 shows an embodiment of an electrical circuit being a possible implementation of a driving circuit for operating a light-emitting diode according to the "common cathode" topology.

FIG. 7 shows a possible implementation for a driving circuit 10 of the "common cathode" topology, as shown in FIG. 2. The first controllable switching circuit 100 comprises a first controllable switch 110 and a second controllable switch 120. The first controllable switch 110 of the first controllable switching circuit 100 is arranged between the first side 301 of the capacitor 300 and the reference potential Vref. The second controllable switch 120 of the first controllable switching circuit 100 is arranged between the first side 301 of the capacitor 300 and the supply potential VDD, for example a positive supply potential. The second controllable switching circuit 200 comprises a first controllable switch 210 and a second controllable switch 220. The first controllable switch 210 of the second controllable switching circuit 200 is arranged between the second side 302 of the capacitor 300 and the supply potential VDD. The second controllable switch 220 of the second controllable switching circuit 200 is arranged between the second side 302 of the capacitor 300 and the external terminal LEDA.

According to the "common cathode" topology of the driving circuit 10, the controllable switches 110, 120 and 210, 220 are embodied as transistors. In particular, the controllable switches 120, 210 and 220 are respectively configured as PMOS transistors and the controllable switch 110 is configured as an NMOS transistor.

According to the embodiment of the driving circuit 10 shown in FIG. 7, the driving circuit 10 comprises a controllable bulk switch 600 to selectively connect a bulk connection of the controllable switch/transistor 210 to one of the second side 302 of the capacitor 300 and the supply potential VDD.

In the first operating state/pre-charge state of the driving circuit 10, the controllable bulk switch 600 is controlled such that the bulk connection of the controllable switch/transistor 210 is connected to the supply potential VDD. In the second operating state of the driving circuit 10, the controllable bulk switch 600 is controlled such that the bulk connection of the controllable switch/transistor 210 is connected to the second side 302 of the capacitor 300.

The driving circuit 10 according to the "common anode" topology shown in FIG. 3 as well as the driving circuit 10 according to the "common cathode" topology shown in FIG. 7 respectively comprise a first resistor 710 being arranged between the reference potential Vref and the first side 301 of the capacitor 300. The driving circuit 10 further comprises a second resistor 720 being arranged between the second side 302 of the capacitor 300 and the ground potential, when the driving circuit is implemented according to the "common anode" topology, as shown in FIG. 3. When the driving circuit 10 is configured according to the "common cathode" topology of FIG. 7, the second resistor 720 is arranged between the second side 302 of the capacitor 300 and the supply potential VDD.

The first and second resistors 710, 720 are not required for the basic function of the driving circuit 10. The resistors can be optionally implemented in order to achieve a high pulse rate frequency, because those resistors help to charge the (flying) capacitor 300 already when the first and second controllable switching circuit 100 and 200 are turned in the second operating state. Furthermore, those resistors reduce negative biasing at the second side 302 of the capacitor 300 during the falling edge of the control signal G2, due to charge injection.

Figure 8:
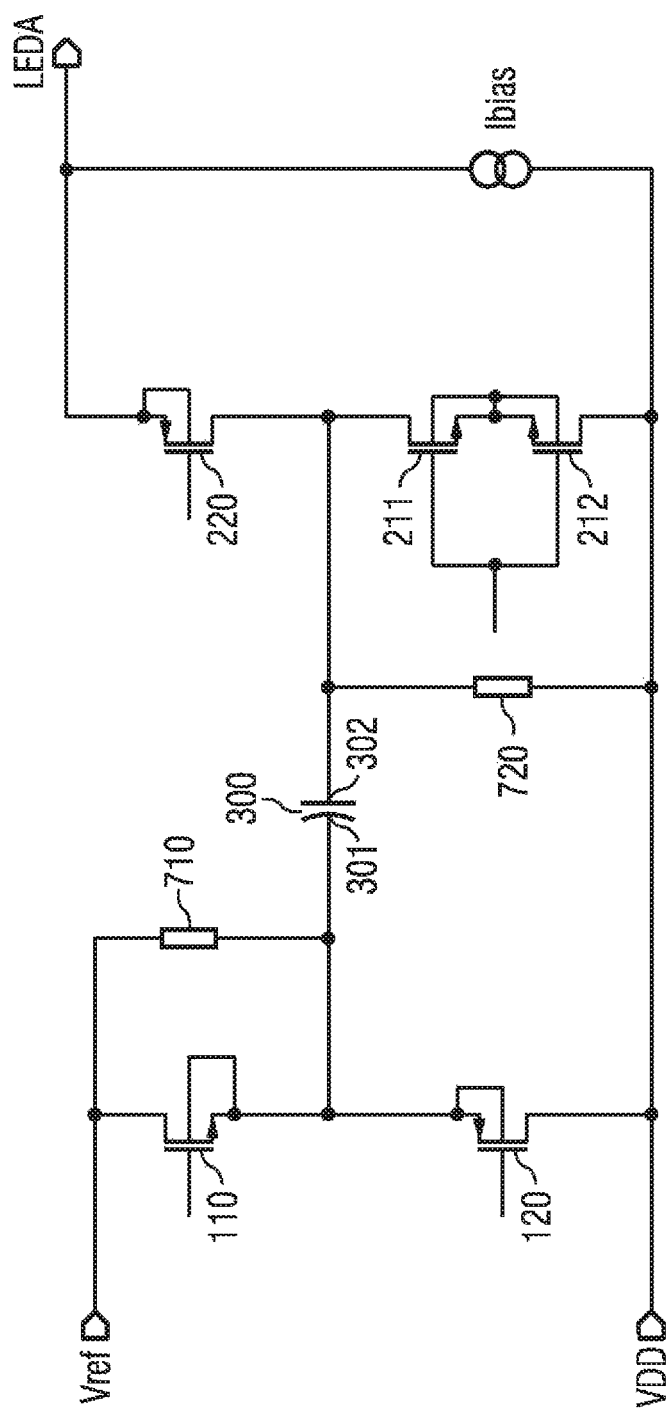
FIG. 8 shows another embodiment of an electrical circuit being a possible implementation of a driving circuit for operating a light-emitting diode in a "common cathode" topology.

FIG. 8 shows an embodiment of the driving circuit 10 according to the "common cathode" topology, wherein the controllable switch 210 comprises a first transistor 211 and a second transistor 212 being connected in series between the supply potential VDD and the second side 302 of the capacitor 300 such that a drain connection of the transistor 211 of the controllable switch 210 is connected to the second side 302 of the capacitor 300 and a drain connection of the second transistor 212 of the controllable switch 210 is connected to the supply potential VDD. The transistors 211 and 212 may be configured according to the PMOS type.

According to the embodiment of the driving circuit 10 shown in FIG. 8, the controllable bulk switch 600 and the controllable switch 210 are embodied as a series connected PMOS transistor pair. A respective bulk connection of the transistors 211 and 212 is connected to the common source connection of the transistors 211 and 212. According to this embodiment, the switched bulk automatically becomes biased to the higher potential of both drain connections of the transistors 211 and 212 and therefore, one of the transistors is always operated in an open state when the gate is pulled "high".

The driving circuit 10 provides a signal pulse being configured as a high peak output current SP because of bootstrapping and an ultrashort pulse width achievable with standard CMOS process. Furthermore, no bulky RF components are required. The driving circuit allows a simple and accurate control of pulse output energy, stored in the (flying) capacitor 300. Furthermore, high pulse repetition rates are achievable, particularly pulse repetition rates of up to 100 MHz. The driving circuit is characterized by low power consumption. In particular, no high-current bias replica branch is required.

Figure 9:
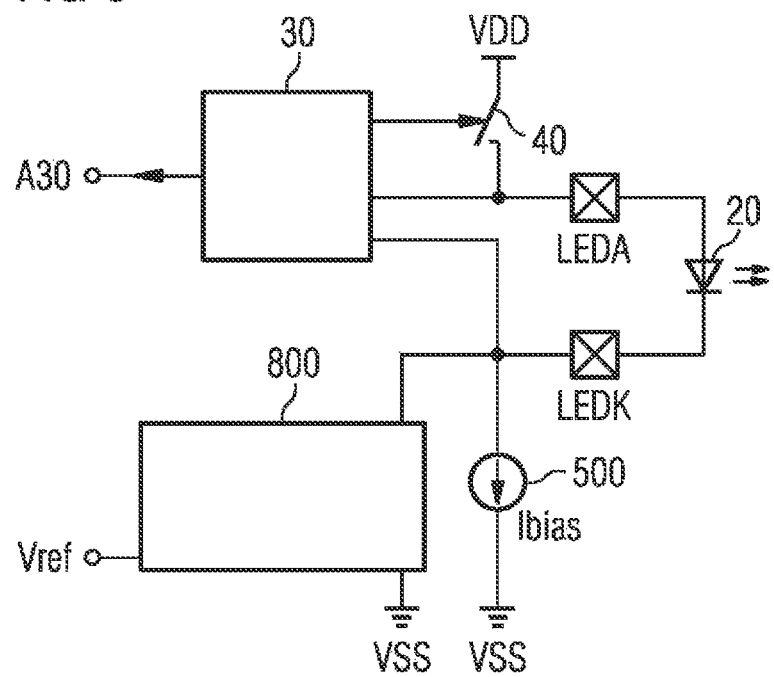
FIG. 9 shows an embodiment of an arrangement to provide light pulses comprising a driving circuit according to a "common anode" topology and an eye safety control circuit.

FIG. 9 shows an embodiment of the arrangement 1 to provide light pulses for operating the light-emitting diode 20 according to a "common anode" topology of a driving circuit 10. The driving circuit 10 comprises a charge pump 800 including the switching circuits 100, 200 and the capacitor 300, as illustrated in FIG. 1. In addition, the arrangement 1 of FIG. 9 comprises an eye safety control circuit 30 to control a controllable switch 40. In the closed state, the controllable switch 40 connects the supply potential VDD to the external terminal LEDA and thus to the light-emitting diode 20.

The eye safety control circuit 30 is configured to monitor an operation state of the light-emitting diode 20 to switch off the diode 20 in the case that a failure, i.e. a short of the light-emitting diode 20 to the supply potential VDD or the ground potential VSS as well as an idle state of the light-emitting diode 20 occur. If one of these fail operating states of the light-emitting diode 20 is detected by the eye safety control circuit 30, the controllable switch 40 is controlled to be switched from the closed to the open state to interrupt the connection of the light-emitting diode 20 to the supply potential VDD. A status signal indicating the operation state of the light-emitting diode may be output by the eye safety control circuit 30 at an output node A30. In case of a failure, the eye safety control circuit 30 prevents that the light-emitting diode permanently emits light. The providing of the eye safety control circuit 30 is not restricted to the "common anode" topology of the driving circuit 10 and can also be used for the "common cathode" topology of the driving circuit 10.

FIG. 10 shows another embodiment of the arrangement 1 to provide light pulses. The arrangement comprises the components shown in FIG. 9 and additionally comprises a second charge pump 50. The charge pump 50 is connected between the supply potential VDD and the external terminal LEDA of the light-emitting diode 20. The charge pump 50 is configured to provide a multiple of the supply potential VDD at the external terminal LEDA to operate the light-emitting diode 20. The configuration shown in FIG. 10 allows to boost the light power emitted by the light-emitting diode 20 and thus to increase the range of a time-of-flight measurement system. Since the charge pump 50 already includes at least a controllable switch to couple the light-emitting diode 20 to the supply potential VDD, the controllable switch 40 may be omitted and the eye control safety circuit 30 may control the controllable switch(es) within the charge pump 50 to disconnect the light-emitting diode from the supply potential in case of a failure.

LIST OF REFERENCE SIGNS 1 arrangement to provide light pulses
10 driving circuit
20 light-emitting diode
30 control circuit
40 controllable switch
50 charge pump
100 first controllable switching circuit
110, 120 first/second controllable switch
200 second controllable switching circuit
210, 220 first/second controllable switch
300 capacitor
400 control circuit
500 current source
600 controllable bulk switch
610, 620 controllable switches
710, 720 resistors
800 charge pump

The invention claimed is:

1. A driving circuit to generate a signal pulse for operating a light-emitting diode, comprising:
an external terminal to connect the light-emitting diode to the driving circuit,
a first internal node to apply one of a supply and ground potential,
a second internal node to apply a reference potential,
a third internal node being connected to the external terminal,
a fourth internal node to apply one of the supply and ground potential,
a capacitor to provide a charge to generate the signal pulse at the external terminal for operating the light-emitting diode,
a first and a second controllable switching circuit,
wherein the capacitor has a first side being coupled to the first controllable switching circuit and a second side being coupled to the second controllable switching circuit,
wherein the first controllable switching circuit is configured to selectively either connect the first side of the capacitor to the first internal node and disconnect the first side of the capacitor from the second internal node, or connect the first side of the capacitor to the second internal node and disconnect the first side of the capacitor from the first internal node in dependence on a switching state of the first controllable switching circuit, and
wherein the second controllable switching circuit is configured to selectively either connect the second side of the capacitor to the third internal node and disconnect the second side of the capacitor from the fourth internal node, or connect the second side of the capacitor to the fourth internal node and disconnect the second side of the capacitor from the third internal node in dependence on a switching state of the second controllable switching circuit.

2. The driving circuit of claim 1,
wherein the driving circuit is operable in a first and a second operating state,
wherein, in the first operating state, the first controllable switching circuit connects the first side of the capacitor to the reference potential and the second controllable switch connects the second side of the capacitor to said one of the supply and ground potential,
wherein, in the second operating state, the first controllable switching circuit connects the first side of the capacitor to said one of the supply and ground potential and the second controllable switch connects the second side of the capacitor to the external terminal.

3. The driving circuit of claim 1, comprising:
a control circuit being configured to provide a first control signal to control the first controllable switching circuit and a second control signal to control the second controllable switching circuit,
wherein the control circuit is configured to generate the first and second control signal simultaneously.

4. The driving circuit of claim 1, comprising:
a current source to provide a bias current to the external terminal,
wherein the current source is arranged between the external terminal and said one of the supply and ground potential.

5. The driving circuit of claim 1,
wherein the first controllable switching circuit comprises a first controllable switch and a second controllable switch,
wherein the first controllable switch of the first controllable switching circuit is arranged between the first side of the capacitor and the reference potential,
wherein the second controllable switch of the first controllable switching circuit is arranged between the first side of the capacitor and said one of the supply and ground potential.

6. The driving circuit of claim 1,
wherein the second controllable switching circuit comprises a first controllable switch and a second controllable switch, wherein the first controllable switch of the second controllable switching circuit is arranged between the second side of the capacitor and said one of the supply and ground potential, wherein the second controllable switch of the second controllable switching circuit is arranged between the second side of the capacitor and the external terminal.

7. The driving circuit of claim 6,
wherein the first controllable switch of the second controllable switching circuit comprises a transistor.

8. The driving circuit of claim 7, comprising:
a controllable bulk switch to selectively connect a bulk connection of the transistor of the first controllable switch of the second controllable switching circuit to one of the second side of the capacitor and said one of the supply and ground potential.

9. The driving circuit of claim 8,
wherein, in the first operating state of the driving circuit, the controllable bulk switch is controlled such that the bulk connection of the transistor of the first controllable switch of the second controllable switching circuit is connected to said one of the supply and ground potential,
wherein, in the second operating state of the driving circuit, the controllable bulk switch is controlled such that the bulk connection of the transistor of the first controllable switch of the second controllable switching circuit is connected to the second side of the capacitor.

10. The driving circuit of claim 6,
wherein the first controllable switch of the second controllable switching circuit comprises a first and a second transistor being connected in series between said one of the supply and ground potential and the second side of the capacitor such that a drain connection of the first transistor of the first controllable switch of the second controllable switching circuit is connected to the second side of the capacitor and a drain connection of the second transistor of the first controllable switch of the second controllable switching circuit is connected to said one of the supply and ground potential.

11. The driving circuit of claim 10,
wherein the first and second transistor of the first controllable switch of the second controllable switching circuit have a common source connection,
wherein a respective bulk connection of the first and second transistor of the first controllable switch of the second controllable switching circuit are connected to the common source connection of the first and second transistor of the first controllable switch of the second controllable switching circuit.

12. The driving circuit of claim 1, comprising:
a first resistor being arranged between the reference potential and the first side of the capacitor,
a second resistor being arranged between the second side of the capacitor and said one of the supply and ground potential.

13. An arrangement to provide light pulses, comprising:
a light-emitting diode,
a driving circuit to generate a signal pulse for operating the light-emitting diode comprising:
an external terminal to connect the light-emitting diode to the driving circuit,
a first internal node to apply one of a supply and ground potential,
a second internal node to apply a reference potential,
a third internal node being connected to the external terminal,
a fourth internal node to apply one of the supply and ground potential,
a capacitor to provide a charge to generate the signal pulse at the external terminal for operating the light-emitting diode,
a first and a second controllable switching circuit,
wherein the capacitor has a first side being coupled to the first controllable switching circuit and a second side being coupled to the second controllable switching circuit,
wherein the first controllable switching circuit is configured to selectively connect the first side of the capacitor to the first internal node and disconnect the first side of the capacitor from the second internal node, or connect the first side of the capacitor to the second internal node and disconnect the first side of the capacitor from the first internal node in dependence on a switching state of the first controllable switching circuit,
wherein the second controllable switching circuit is configured to selectively either connect the second side of the capacitor to the third internal node and disconnect the second side of the capacitor from the fourth internal node, or connect the second side of the capacitor to the fourth internal node and disconnect the second side of the capacitor from the third internal node in dependence on a switching state of the second controllable switching circuit, and
wherein the light-emitting diode is connected to the external terminal of the driving circuit.

14. The arrangement of claim 13,
wherein the current source of the driving circuit is configured to provide the bias current with a level below a threshold current level of the light-emitting diode for emitting light.

15. The arrangement of claim 13,
wherein the light-emitting diode is configured as a laser diode.

* * * * *